United States Patent [19]
Jacobus, Jr. et al.

[11] 3,946,417
[45] Mar. 23, 1976

[54] MINIMIZING CROSS-TALK IN L.E.D. ARRAYS

[75] Inventors: William N. Jacobus, Jr., Essex Junction, Vt.; San-Mei Ku, Poughkeepsie, N.Y.

[73] Assignee: IBM Corporation, Armonk, N.Y.

[22] Filed: Aug. 12, 1974

[21] Appl. No.: 496,481

Related U.S. Application Data

[62] Division of Ser. No. 265,122, June 22, 1972, Pat. No. 3,846,193.

[52] U.S. Cl. ..................... 357/17; 357/18; 357/54; 357/52
[51] Int. Cl.² H01L 33/00; H01L 29/34; H01S 33/19
[58] Field of Search ............. 357/17, 18, 31, 48, 52, 357/19, 5.4

[56] References Cited
UNITED STATES PATENTS

| | | | |
|---|---|---|---|
| 3,293,513 | 12/1966 | Biard | 317/237 |
| 3,617,929 | 11/1971 | Strock | 331/94.5 |
| 3,703,669 | 11/1972 | London | 317/235 R |
| 3,817,798 | 6/1974 | Jacobus | 148/187 |

OTHER PUBLICATIONS

Herzog et al., J. Appl. Phys., Vol. 43, No. 2, Feb. 1972, pp. 600–608.

*Primary Examiner*—Martin H. Edlow
*Attorney, Agent, or Firm*—T. E. Gelanthay

[57] ABSTRACT

Disclosed is a semiconductor light emitting diode (LED) array in which "cross-talk" between adjacent diodes in the array is minimized. The disclosed LED arrays have an absorbing layer on the backside of the devices and/or a guard ring region surrounding each device in order to absorb spurious reflections within the semiconductor crystal. Disclosed also is a method of making improved light emitting diodes (LED's).

11 Claims, 4 Drawing Figures

MINIMIZING CROSS-TALK IN L.E.D. ARRAYS

This is a division, of application Ser. No. 265,122 filed June 22, 1972, now U.S. Pat. No. 3,846,193.

CROSS REFERENCE TO RELATED APPLICATIONS OR PATENTS

Application, now U.S. Pat. No. 3,817,798, issued June 18, 1974 Ser. No. 200,438, filed Nov. 19, 1971, by the same inventors and assignee as the present application.

BACKGROUND OF THE INVENTION

1. Field of the Invention

This invention relates to light emitting diode (LED) arrays and more particularly to the minimization of cross-talk between adjacent diodes in a LED array.

2. Description of the Prior Art

Where a plurality of light emitting PN junctions are formed on a monolithic array chip, part of the light generated by each PN junction is normally transmitted through the bulk of the chip and reflected from the backside thereof. The reflected light passes back through the bulk and leaves the top side of the chip at another part of the array. This undesirable reflected signal has been referred to as cross-talk. Such cross-talk limits the closeness of the spacing between adjacent LEDs.

SUMMARY OF THE INVENTION

It is accordingly a primary object of this invention to minimize the cross-talk between light emitting diodes.

It is another object of this invention to closely space light emitting devices.

It is a further object of this invention to fabricate improved LED arrays without additional process steps.

The closely spaced diode arrays of this invention are generally formed in accordance with the teachings of our copending patent application Ser. No. 200,438, filed on Nov. 19, 1971. In that application, a light emitting diode array was formed in an N type doped gallium arsenide substrate. Zinc was diffused through a thin silicon dioxide (SiO2) layer to form a P type region within said N type substrate. The masking of the zinc diffusant was performed by a selectively etched layer of silicon nitride ($Si_3N_4$).

In the present invention, during the P type diffusion step, the zinc is also diffused into the back of the gallium arsenide wafer. The diffusion into the backside of the wafer is more concentrated since it does not have to pass through a thin layer of silicon dioxide. It was found that the PN junction formed by this diffused P layer absorbs light that was previously reflected from the backside of the wafer, thereby minimizing cross-talk.

In accordance with another aspect of this invention, it was further found that a guard ring could be diffused into the top surface of the wafer also during the same step as the previously described diffusions. In order to diffuse a guard ring deeper than the light emitting junction, the diffusion step is preceded by a selective etching of the silicon dioxide (SiO2) layer. This permits the guard ring to be diffused as deep as the diffusion into the back surface of the wafer.

The foregoing and other objects, features and advantages of this invention will be apparent from the following more particular description of the preferred embodiments of the invention, as illustrated in the accompanying drawings.

DESCRIPTION OF THE PREFERRED EMBODIMENTS

Figure 1:
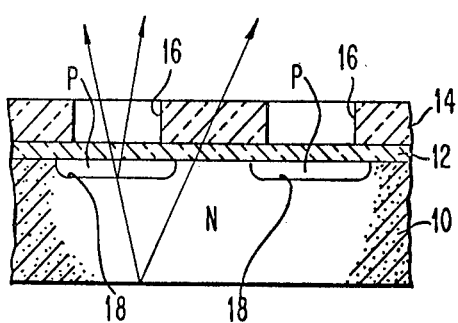
FIG. 1 is a fragmentary section of a closely spaced light emitting diode array without the cross-talk eliminating feature.

Referring to FIG. 1, there is disclosed a fragmentary section of a light emitting diode array fabricated in accordance with our prior patent application Ser. No. 200,438. The drawings and specification of this aforementioned patent application are hereby incorporated herein by reference. A substrate 10 of gallium arsenide doped with an N type impurity from a group of elements consisting of tin, tellurium, selenium, etc., for example, is coated with a thin oxide layer 12 of silicon dioxide (SiO2). The layer 12 should consist of material relatively transparent to the subsequent diffusion of a desired impurity. Layer 14 consisting of silicon nitride ($Si_3N_4$), for example, being impervious to a subsequent diffusion of impurities is deposited over the layer 12. Layer 14 is then selectively etched, preferably by hot phosphoric acid which will open windows 16 in those areas where light emitting devices are desired. The preferably perferably will etch away the silicon nitride layer 14 without significantly attacking the layer 12. Diffusion of the P type impurity such as zinc for example provides a light emitting PN junction 18.

FIG. 1 further shows how the light rays generated at the PN junction 18 are reflected from the backside of the substrate 10 and pass through the front side at points other than through windows 16. This phenomenon has previously been referred to as cross-talk and is undesirable.

Figure 2:
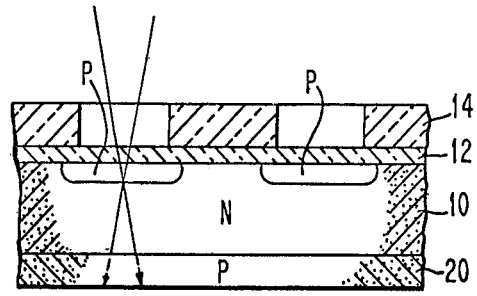
FIG. 2 is a fragmentary section of a light emitting diode array having a light absorbing region on the back surface.

Refer now to FIG. 2 where the cross-talk has been minimized in accordance with one aspect of the invention. Corresponding portions of the fragmentary view of the light emitting diode array have been correspondingly numbered. It is noted that a P type impurity layer 20 has been diffused into the backside of substrate 10. Since the backside of substrate 10 does not have a layer 12 deposited thereon, the P type diffusion 20 is 3 to 4 times deeper than the junction 18, assuming that all diffusions are performed simultaneously in a single step. Thus, assuming a substrate thickness of approximately 10 mils, the junction depth 18 can be approximately 5 to 10 microns while the backside diffusion depth is in the range of from 1 to 1.5 mils. Note that 25 microns equals 1 mil. The backside surface concentration $C_o$ will then be approximately equal to 4–5 × $10^{20}/cm^3$. A diffusion source preferred to pure zinc is a zinc doped gallium arsenide source as described in IBM Technical Disclosure Bulletin Vol. 14, No. 8, Jan. 1972, pages 2529–30.

Figure 3:
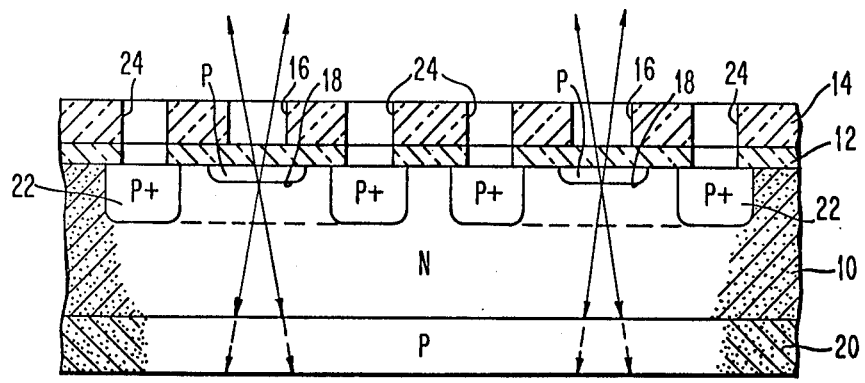
FIG. 3 is a fragmentary view of a light emitting diode array showing a guard ring-like absorbing region as well as a light absorbing region on the back (bottom) surface of the wafer.

Refer now to FIG. 3 for a still further aspect of our invention. This figure has been numbered in the same manner as preceding figures insofar as practical. In addition to the drawing of FIG. 2, FIG. 3 further shows diffused guard rings 22. These guard rings tend to minimize spurious reflections and can be used alone or in combination with the backside diffusion 20. An additional advantage of guard ring 22 is that it further isolates individual light emitting diodes in the array. The formation of the guard ring 22 requires the additional method step of etching away oxide layer 12 to provide openings 24. All diffusions take place simultaneously so that the concentration and depth of the diffusion of guard rings 22 is the same as that for backside diffused region 20.

Figure 4:
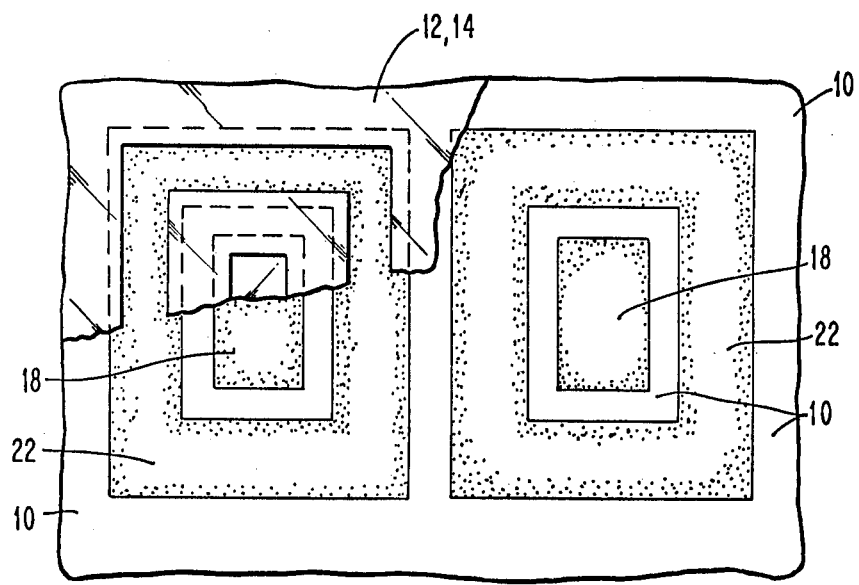
FIG. 4 is a partially cut-away top view of FIG. 3.

Refer now to FIG. 4 which is a top view of FIG. 3. Corresponding elements have again been correspondingly numbered. The top view clearly shows the heavily doped P type guard ring region surrounding each light emitting device. Note that in FIG. 4, the guard ring is shown surrounding each device. Of course, the guard ring could be applied in a grid like pattern resulting in more closely spaced devices with only a single region of heavily doped P type material between devices.

In the foregoing description of the preferred embodiment, gallium arsenide (GaAs) having either [100] or [110] orientation was described. Those skilled in the art will readily recognize that our invention is equally applicable to all types of Group III-V semiconductors and mixed compounds from the Group III-V semiconductors. Also, instead of a substrate that is medium doped with N type impurity with a P type active region, the opposite conductivity types would be a mere substitution to those skilled in the art. If a different orientation crystal such as [111] is to be used, then it must be recognized that one planar face of the crystal would always be composed of arsenic atoms while the other surface is composed of gallium atoms. In this case, it is desirable to diffuse into the planar surface having arsenic atoms at the surface because of a faster diffusion of devices into arsenic than gallium.

Devices fabricated in accordance with our invention can be rectangular measuring 4 mils by 5 mils and producing approximately 250 microwatts. Each of the disclosed techniques (i.e. backside diffusion and guard ring) reduce the top surface emission due to backside reflection (cross-talk) by a factor of $10^{-9}$.

While the invention has been particularly shown and described with reference to preferred embodiments thereof, it will be understood by those skilled in the art that the foregoing and other changes in form and detail may be made therein without departing from the spirit and scope of the invention.

We claim:
1. An array of closely spaced light emitting devices comprising:
    a semiconductor substrate including materials from the Group III-V elements and doped with an impurity of a first conductivity type;
    a thin layer of silicon oxide material in adherent contact with a first major surface of said substrate;
    a layer of silicon nitride material in adherent contact with selected portions of said silicon oxide;
    an impurity of a second conductivity type being introduced into said substrate through said silicon oxide layer as masked by the said layer of silicon nitride material forming a P-N junction; and
    a light absorbing layer formed by said impurity of said second conductivity type being also introduced into a second major surface, contiguous with the entire second major surface of said substrate.

2. An array of closely spaced light emitting devices as in claim 1 further comprising:
    light absorbing guard ring regions integral with said first major surface of said substrate substantially surrounding each P-N junction, said guard ring regions having introduced therein an impurity of said second conductivity type.

3. An array of closely spaced light emitting devices as in claim 2 wherein said guard ring is substantially the same depth and concentration as said impurity integral with said second major surface.

4. An array of closely spaced light emitting devices as in claim 3 wherein each said stated depths are at least three times as deep as the said impurity introduced through said silicon oxide layer.

5. An array of closely spaced light emitting devices comprising:
    a semiconductor substrate consisting of a mixed compound from the Group III-V elements and doped with impurities of a first conductivity type;
    a thin layer of silicon oxide material in adherent contact with a first major surface of said substrate;
    a layer of silicon nitride material in adherent contact with selected portions of said silicon oxide;
    an impurity of a second conductivity type being introduced into said substrate through said silicon oxide layer as masked by the said layer of silicon nitride material forming a pluraity of P-N junctions; and
    a light absorbing layer formed by said impurity of said second conductivity type being also introduced into a second major surface of said substrate.

6. An array of closely spaced light emitting devices as in claim 5 further comprising:
    light absorbing guard ring regions in said first major surface of said substrate substantially surrounding each P-N junction, said guard ring regions having introduced therein an impurity of said second conductivity type.

7. An array of closely spaced light emitting devices as in claim 6 wherein said guard ring in said first surface of said substrate is substantially the same depth and concentration as said impurity in said second major surface.

8. An array of closely spaced light emitting devices as in claim 3 wherein each said stated depths are at least three times as deep as the said impurity introduced through said silicon oxide layer.

9. An array of closely spaced light emitting devices comprising:
    a semiconductor substrate having two major surfaces and including material from the Group III-V elements and doped with an impurity of a first conductivity type;
    a layer of silicon oxide in adherent contact with at least a first one of said major surfaces;
    a layer of silicon nitride, with selective openings etched therein, in adherent contact with said silicon oxide;
    an impurity of a second conductivity type being selectively introduced through the silicon oxide and through said selective openings into said at least first major surface of said substrate, forming P-N junctions and the light emitting devices; and
    a light absorbing layer contiguous with the entire second major surface of said substrate.

10. An array of closely spaced light emitting diodes as in claim 9 further comprising:

light absorbing guard ring regions introduced into said first major surface of said substrate forming P-N junctions with said substrate at a depth greater than the P-N junctions formed for said light emitting devices and substantially surrounding each said light emitting device.

11. An array of closely spaced light emitting devices as in claim 9 wherein each said introduced impurities are ion implanted impurities.

* * * * *